United States Patent [19]

Tanaka et al.

[11] Patent Number: 4,694,429

[45] Date of Patent: Sep. 15, 1987

[54] SEMICONDUCTOR MEMORY DEVICE

[75] Inventors: Sumio Tanaka, Tokyo; Shinji Saito, Yokohama; Shigeru Atsumi, Tokyo; Nobuaki Ohtsuka, Yokohama, all of Japan

[73] Assignee: Kabushiki Kaisha Toshiba, Kawasaki, Japan

[21] Appl. No.: 802,376

[22] Filed: Nov. 27, 1985

[30] Foreign Application Priority Data

Nov. 29, 1984 [JP] Japan ............................... 59-252313
Oct. 8, 1985 [JP] Japan ............................... 60-224060

[51] Int. Cl.$^4$ .............................................. G11C 7/00
[52] U.S. Cl. .................................... 365/189; 365/185
[58] Field of Search ............... 365/226, 189, 185, 203

[56] References Cited

U.S. PATENT DOCUMENTS 4,156,941 5/1979 Homma et al. ................. 365/189 X
4,223,394 9/1980 Pathak et al. ....................... 365/210
4,347,586 8/1982 Natsui ............................ 365/189 X
4,488,263 12/1984 Herndon et al. ..................... 365/189

Primary Examiner—Joseph A. Popek
Attorney, Agent, or Firm—Finnegan, Henderson, Farabow, Garrett & Dunner

[57] ABSTRACT

There is disclosed a semiconductor memory device comprising a memory cell connected to a bit line, and a clamp circuit comprising a load MOS transistor connected between a power source voltage and the bit line, for clamping the power source voltage and applying the clamped voltage to the bit line. The semiconductor memory device further comprises a bypass circuit connected between the bit line and a reference voltage, for bypassing from the bit line to the reference voltage an electric current the amount of which is substantially equal to that of a weak inversion current of the load MOS transistor flowing into said bit line.

12 Claims, 13 Drawing Figures

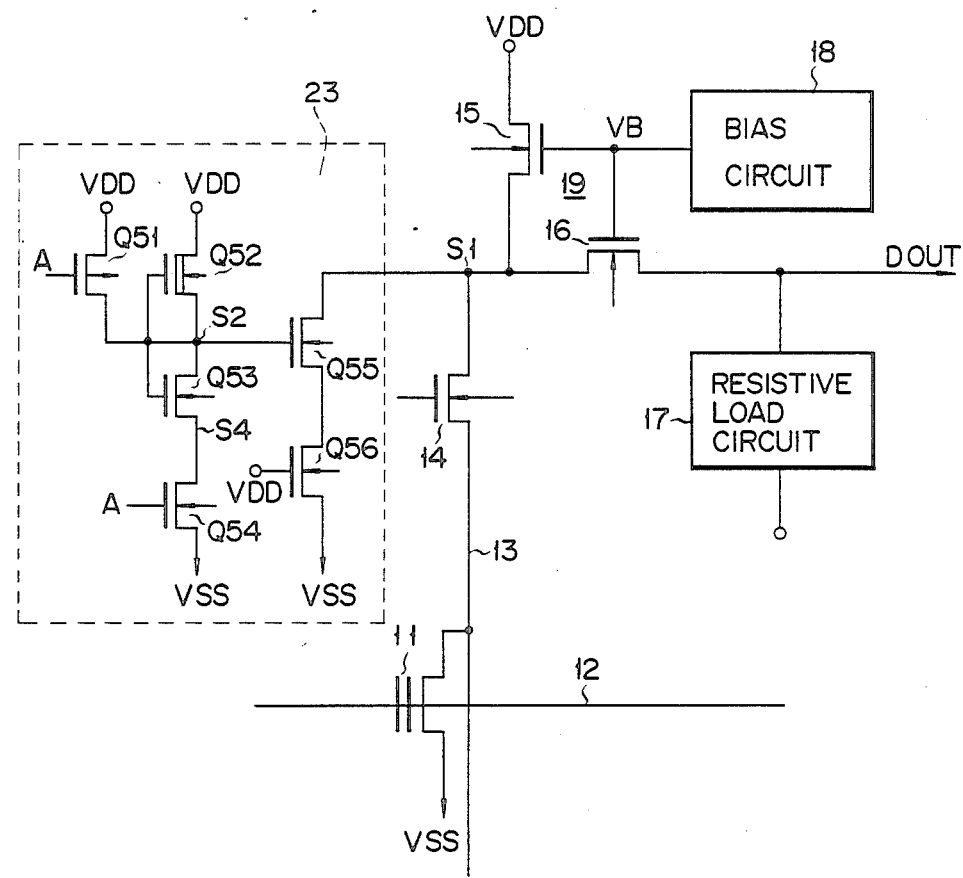
F I G. 9

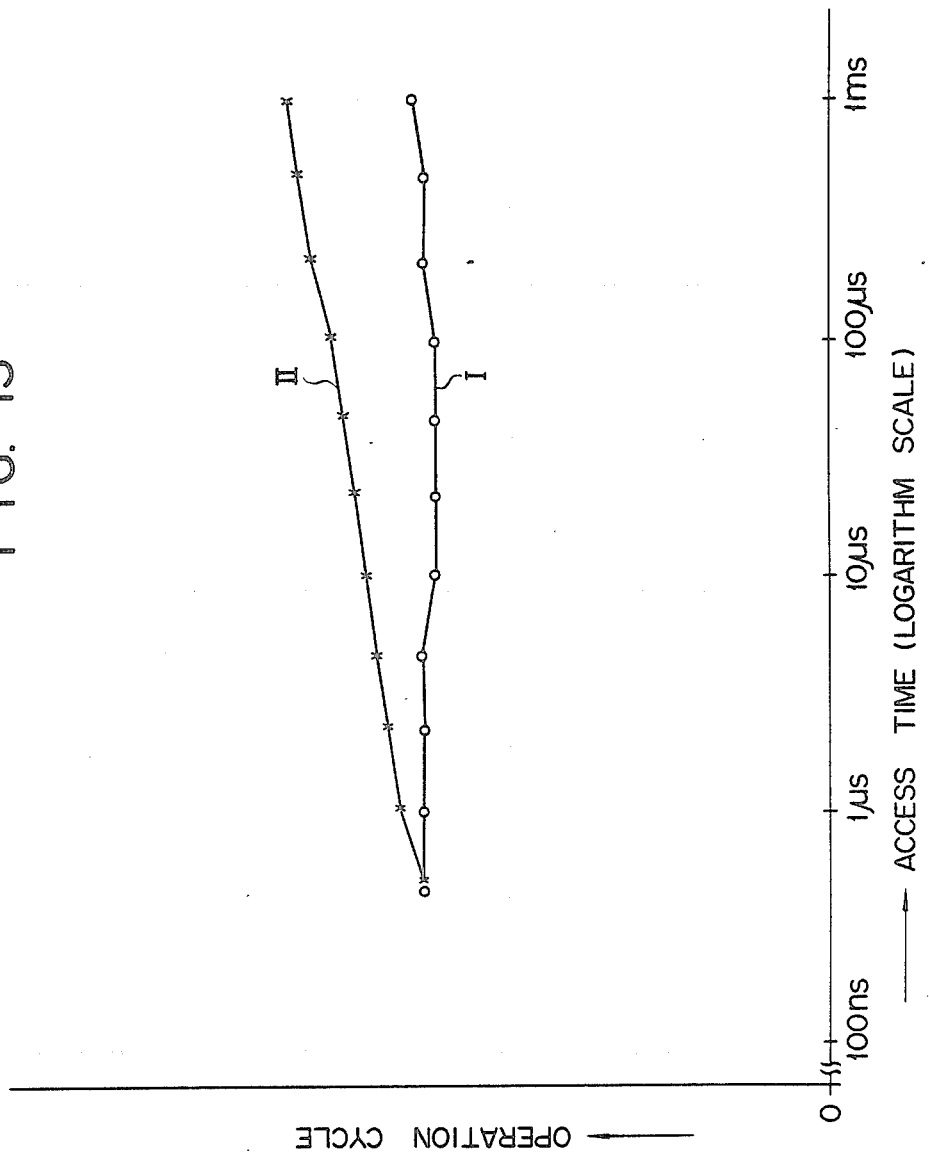

SEMICONDUCTOR MEMORY DEVICE

BACKGROUND OF THE INVENTION

The present invention relates to a semiconductor memory device, and more particularly to improvements on a read out circuit in a nonvolatile memory device.

In a semiconductor memory device, bit lines contained in its read out circuit are accompanied inevitably by stray capacitance. The stray capacitance impedes the memory operation. A measure, which has been taken for this problem, employs a clamp circuit connected to each bit line. The clamp circuit clamps a bit signal to restrict the stray capacitance distributed in association with the bit line. For a short memory cycle, this measure effectively restricts the stray capacitance problem. For a long memory cycle, however, it ineffectively restricts the stray capacitance. When the memory operation cycle is long, weak inversion currents are produced in the transistors in the clamp circuit. The weak inversion currents increase a maximum amplitude of the bit signal. The increased maximum amplitude of the bit signal elongates a discharge time of the bit line, and therefore elongates an access time of the memory device.

A semiconductor memory device of prior art will be described referring to FIG. 1. The semiconductor memory device shown in FIG. 1 is an EPROM. Each memory cell of the memory device is a MOS (metal oxide semiconductor) transistor of the double silicon structure with a floating gate. In FIG. 1, reference numeral 12 designates a word line, and reference numeral 13 designates a bit line. A bit select transistor 14 is inserted in the bit line 13. A relatively large capacitance is distributed over the bit line. The capacitance delays a signal propagating on the bit line 13. To minimize the signal delay, a clamp circuit 19 consisting of transistors 15 and 16 is provided and clamps the amplitude of the signal on the bit line 13 to a small limited value. The amplitude limited signal is applied to a resistive load 17. The signal appearing across the load 17 is amplified by a post stage amplifier (not shown).

A delay time of the signal on the bit line 13 is expressed by $C_{BIT} \times \Delta V / I_{CELL}$ where $C_{BIT}$ is the capacitance of the bit line 13, $\Delta V$ an amplitude of a signal on the bit line 13, and $I_{CELL}$ a cell current flowing through the transistor 11. The expression shows that a delay time of the signal on the bit line 13 is proportional to the signal amplitude on the bit line 13. The amplitude of the bit line signal is set at approximately 0.2 V.

The clamp circuit 19 clamps a maximum signal voltage of the bit line signal to $1 V = V_B - V_{TN}$, specifying that the output voltage $V_B$ of a bias circuit 18 is 2 V, the power source potential $V_{DD}$ is 5 V, and the threshold voltage $V_{TN}$ of each transistor 15 and 16 is 1 V.

However, only when the memory device operates in an ordinary short operating cycle, the maximum potential on the bit line 13 can be limited to 1 V. In a long operating cycle, weak inversion currents flow through the transistors 15 and 16 of the clamp circuit, so that the maximum potential on the bit line exceeds 1 V. As a result, the signal amplitude $\Delta V$ is increased up to about 0.5 V, for example. Accordingly, a discharge time of the bit line is longer than that in the case of 0.2 V for the maximum potential. Therefore, an access time to the memory is also long.

SUMMARY OF THE INVENTION

Accordingly, an object of the present invention is to provide a semiconductor memory device which can operate with a short access time even for a long memory operation, with the circuit arrangement free from the weak inversion current.

According to the invention, there is provided a semiconductor memory device comprising a bit line, a memory cell connected to said bit line, clamp circuit means connected between a power source voltage and said bit line, for clamping said power source voltage and for applying the clamped voltage to said bit line, said clamp circuit means comprising a load MOS transistor whose output current path is connected between said power source voltage and said bit line, bypass circuit means connected between said bit line and a reference voltage, for bypassing from said bit line to said reference voltage an electric current the amount of which is substantially equal to that of a weak inversion current of said load transistor flowing into said bit line, said bypass circuit means comprising a bypass MOS transistor whose output current path is connected between said bit line and said reference voltage, and bias circuit means connected to said load MOS transistor and said bypass MOS transistor, for biasing said load and bypass MOS tansistors.

According to the invention, there is further provided a semiconductor memory device comprising a bit line, a memory cell connected to said bit line, clamp circuit means connected between a power source voltage and said bit line, for clamping said power source voltage and for applying the clamped voltage to said bit line, said clamp circuit means comprising a load MOS transistor whose output current path is connected between said power source voltage and said bit line, bypass circuit means connected between said bit line and a reference voltage, for bypassing from said bit line to said reference voltage an electric current the amount of which is substantially equal to that of a weak inversion current of said load transistor flowing into said bit line, said bypass circuit means comprising an N channel MOS transistor (Q52, Q53) of depletion type whose gate and source are interconnected, and the N channel MOS transistor having a constant current nature, and bias circuit means connected to said load MOS transistor, for biasing said load tansistor.

BRIEF DESCRIPTION OF THE DRAWINGS

FIGS. 3 to 9, respectively, show the signal read out circuit of semiconductor memory devices according to other embodiments of the present invention;

FIG. 13 shows a relationship between a memory operation cycle and an access time of the semiconductor memory device of the present invention shown in FIG. 2 and that of prior art shown in FIG. 1.

DETAILED DESCRIPTION OF THE PREFERRED EMBODIMENTS

To solve above-mentioned problem, it only needs to remove the weak inversion current. To this end, the present invention couples a circuit for discharging the weak inversion current with the clamp circuit.

Figure 2:
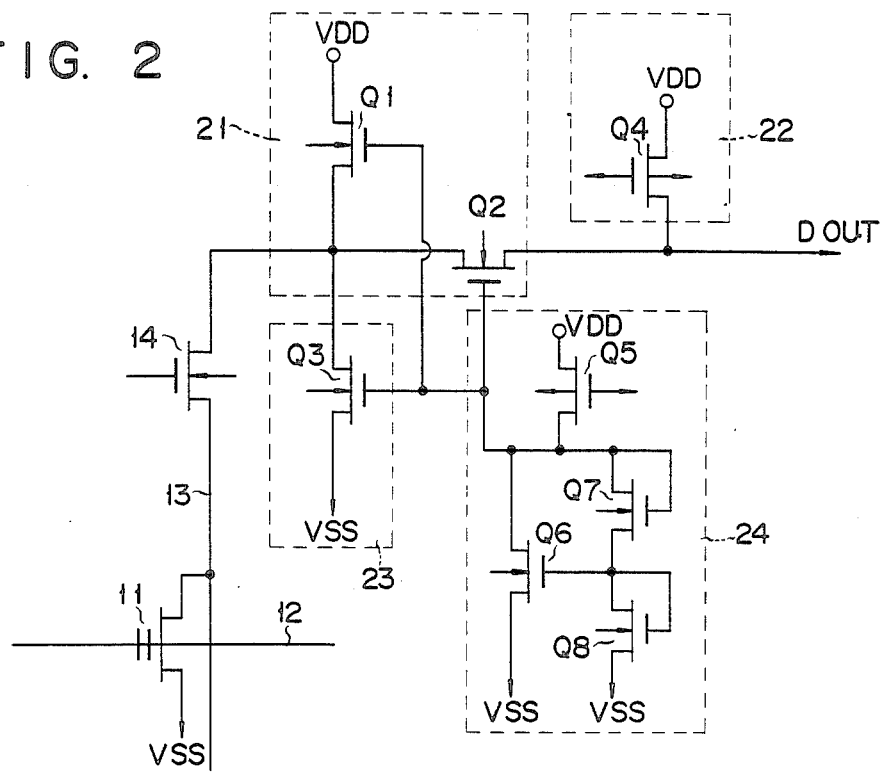
FIG. 2 shows the signal read out circuit of a semiconductor memory device according to an embodiment of the present invention.

A first embodiment implementing such an idea is illustrated in FIG. 2. In FIG. 2, the transistor 11 serves as an EPROM cell. The transistor 11 is an N channel MOS transistor of the double layer polysilicon structure having a floating gate. A transistor 14 serves as a bit line select transistor 14, and is inserted in series in the bit line 13. A word line 12 is connected to the gate of the transistor 11. The drain of the cell transistor 11 is connected to the bit line 13. The source of the transistor 11 is coupled with a low potential power source $V_{SS}$. A clamp circuit 21 is connected to the bit line 13. A resistive load 22 is also connected to the bit line, and sets a bit line potential. A weak inversion current bypassing circuit 23 is coupled with the clamp circuit 21. A bias circuit 24 is coupled with the clamp circuit 21 and the by-passing circuit 23, to bias the transistors of these circuits 21 and 23. Data stored in the cell transistor 11 is transferred to an amplifier (not shown) through the bit line 13. The weak inversion current bypassing circuit 23 is made up of an N channel MOS transistor Q3. The clamp cicuit 21 is made up of N channel MOS transistors Q1 and Q2. The gates of the transistors Q1 to Q3 are connected to the bias circuit 24. The bias circuit 24 applies a bias voltage $2V_{TN}$ to the gates of the transistor Q1 to Q3. VTN represents a threshold voltage of each of the transistor Q1 to Q3. The current paths of the transistors Q1 and Q3 are connected in series between high and low power sources $V_{DD}$ and $V_{SS}$. The current paths of the bit line select transistor 14 and the transistor Q2 are inserted in the bit line 13 in a series fashion. The transistor Q2 in the clamp circuit 21 serves as a transfer gate. The transistor Q1 clamps the bit line voltage at a predetermined voltage. The resistive load 22 is made up of a single P channel transistor 22. One end of the current path of the transistor Q4 is connected to the high potential power source $V_{DD}$, while the other end thereof to the bit line 13. A bit line voltage appearing across the load circuit 22 is sensed and amplified by an amplifier (not shown) provided at the succeeding stage.

The bias circuit 24 is composed of a P channel transistor Q5, and N channel transistors Q6 to Q8. The current paths of the transistors Q5 and Q6 are connected between the power sources $V_{DD}$ and $V_{SS}$. Similarly, the current paths Q5, Q7 and Q8 are connected in series between the power sources $V_{DD}$ and $V_{SS}$. The source of the transistors Q5 and the drains of the transistors Q6 and Q7 are interconnected. This interconnection point provides the $2V_{TH}$ bias voltage The drain and gates of each of the transistor Q7 and Q8 are interconnected. The gate of the transistor Q6 is connected to the source of the transistor Q7 and the drain of the transistor Q8.

As already stated, when the memory operation cycle is long, weak inversion currents are generated by the transistors Q1 and Q2 in the clamp circuit 21. The inversion currents raise the maximum voltage on the bit line 13, to create a long access time problem. The transistor Q3 provides a path for bypassing such inversion current. Accordingly, the width and length of the channel of the transistor Q3 must be so selected as to allow the inversion current to flow into the power source $V_{SS}$.

If the transistor Q3 is appropriately biased, it can bypass the inversion currents without any special design of its channel geometry.

Figure 3:
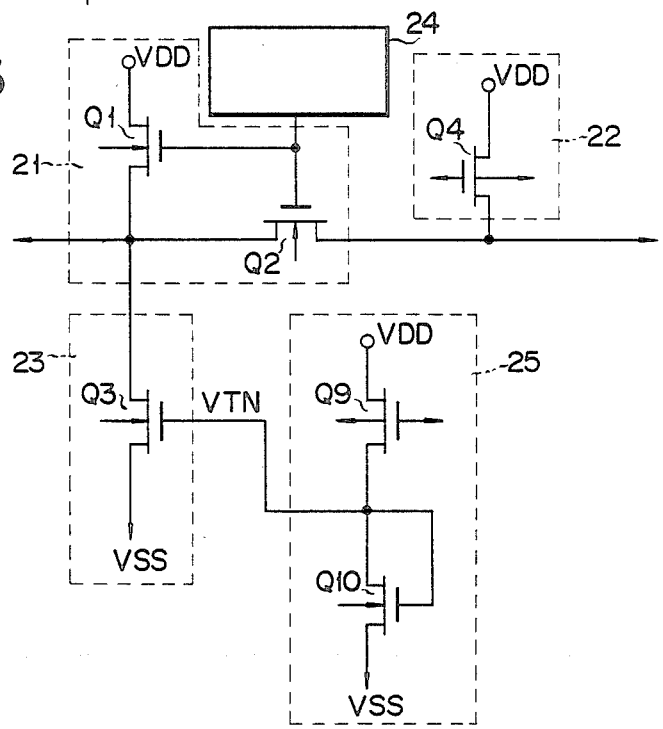

A circuit arrangement designed based on such an idea is shown in FIG. 3. As shown, two bias circuits 24 and 25 are provided. The bias circuit 24 is provided for the transistors Q1 and Q2 in the clamp circuit 21. The bias circuit 25 is only for the transistor Q3 of the bypassing circuit 23. The bias circuit 25 biases the transistor Q3 by a voltage $V_{TH}$, which is equal to the threshold voltage of the transistor Q3. As shown, the bias circuit 25 is made up of a P channel MOS transistor Q9 and an N channel MOS transistor Q10 which is diode-connected. The current paths of these transistors Q9 and Q10 are interconnected. The interconnection point provides the $V_{TH}$ bias voltage.

Figure 4:
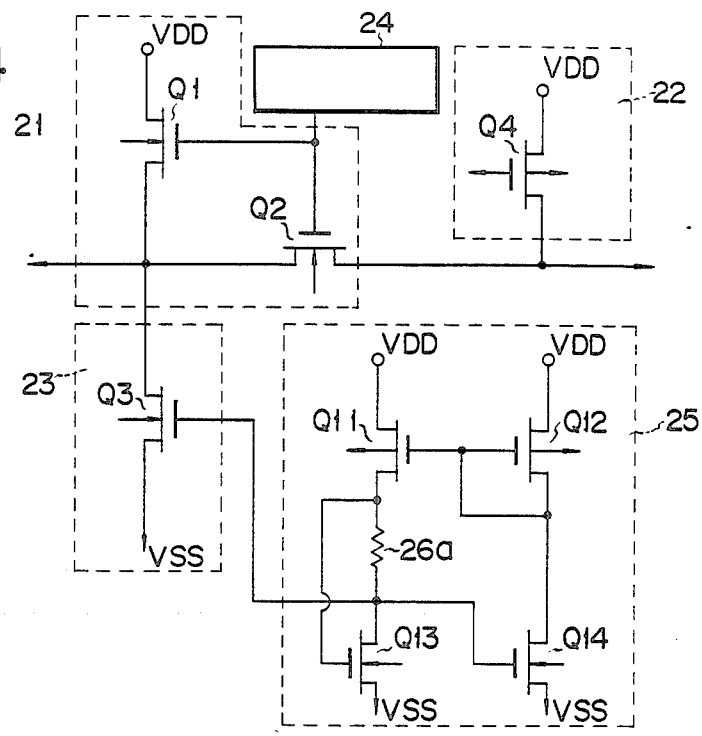

A modification of the FIG. 3 embodiment is shown in FIG. 4. In this embodiment, the bias circuit 25 is designed so as to provide a more precise bias voltage. Accordingly, the FIG. 4 embodiment can more precisely control the weak inversion current flowing through the transistor Q3. As shown, the bias circuit 25 is comprised of transistors Q11 to Q14, and a resistor 26a. The transistors Q11 and Q12 form a current mirror circuit. A voltage caused across the resistor 26a when the mirror current flows, is used as the bias voltage of the transistor Q3. The resistor 26a is a polysilicon resistor or an impurity diffusion resistor.

The bias voltage produced by the bias circuit 25 thus constructed does not vary even if the threshold voltage of the transistors Q11 to Q14 vary from the design values or even if the power source voltage varies. Therefore, the transistor Q3 of the bypassing circuit 23 can stably and precisely be controlled.

Figure 5:
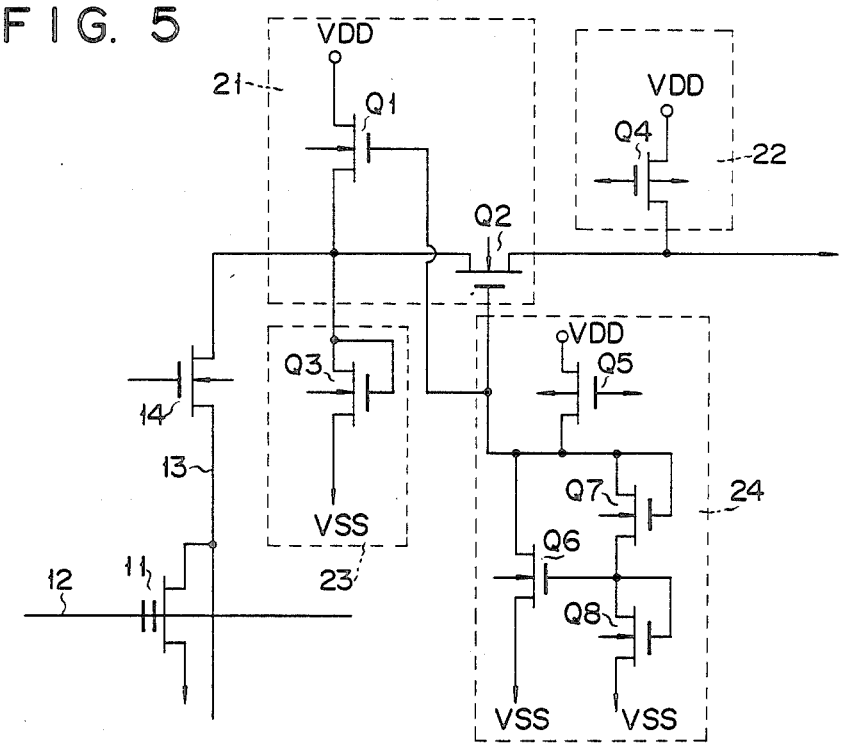

A further modification of the FIG. 3 embodiment is illustrated in FIG. 5. In this embodiemnt, the transistor Q3 is self-biased, with a connection of the drain to the gate.

Figure 6:
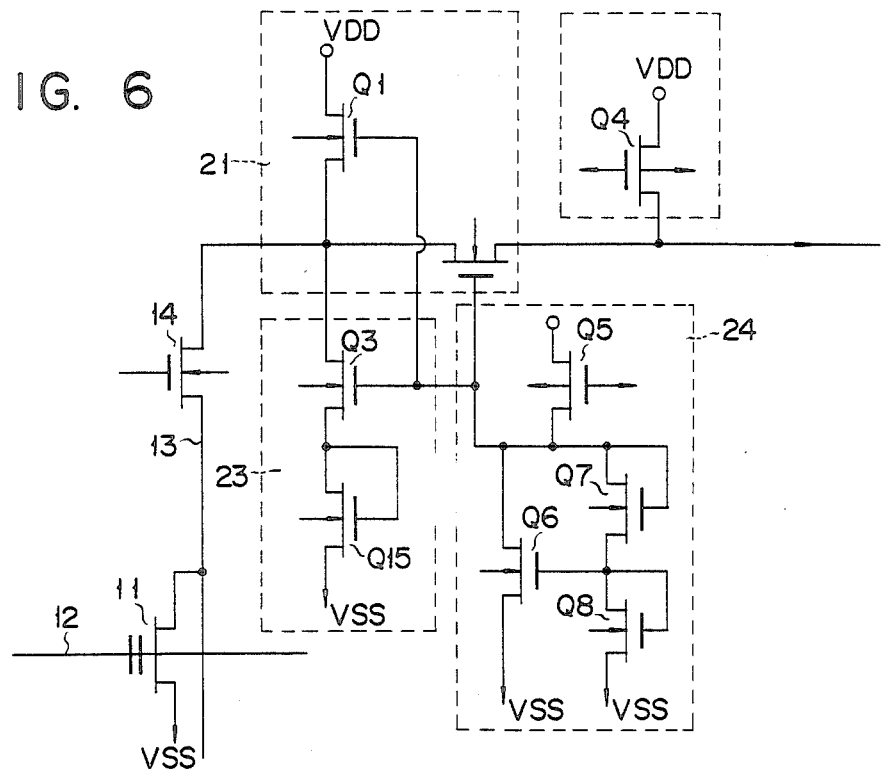

In an embodiment shown in FIG. 6, the bypassing circuit 23 comprises the transistor Q3 and another self-biased tranistor Q15. As in the FIG. 2 embodiment, the single bias circuit 24 supplies a bias voltage to the transistors Q1 to Q3. In this embodiment, the channel geometry of the transistor Q3 may be equal to that of the transistor Q1. The additional transistor Q15 adjusts the current flowing through the transistor Q3.

Figure 7:
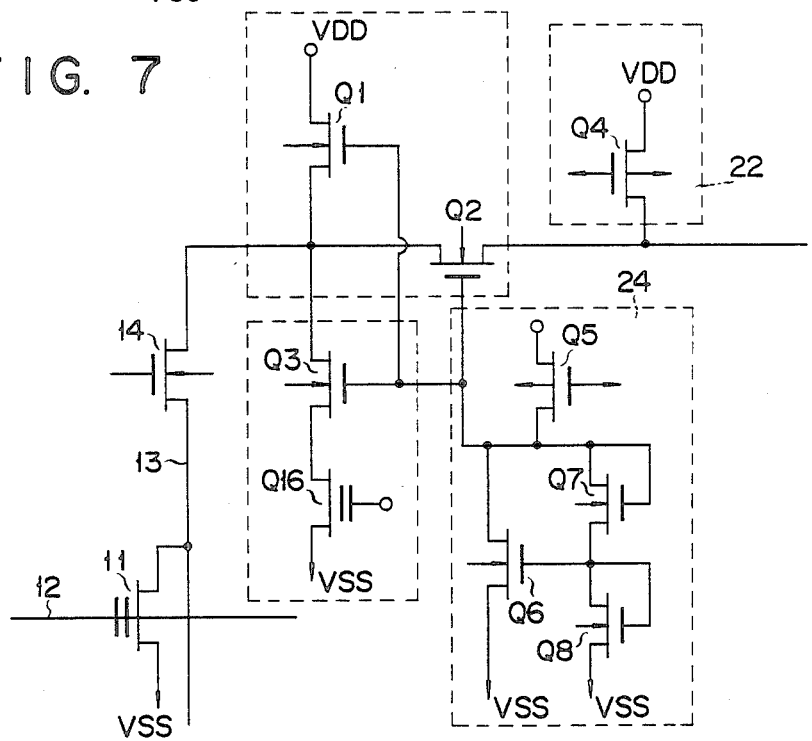

A further embodiment of the semiconductor memory device according to the present invention is illustrated in FIG. 7. This embodiment is featured in that an N channel MOS transistor Q16 of the floating gate type is additionally connected to the transistor Q3 in series fashion. A desired bias voltage is applicable to the gate of the transistor Q16. The application of the desired bias voltage enables the weak inversion current flowing through the transistor Q3 to precisely be adjustable.

Figure 8:
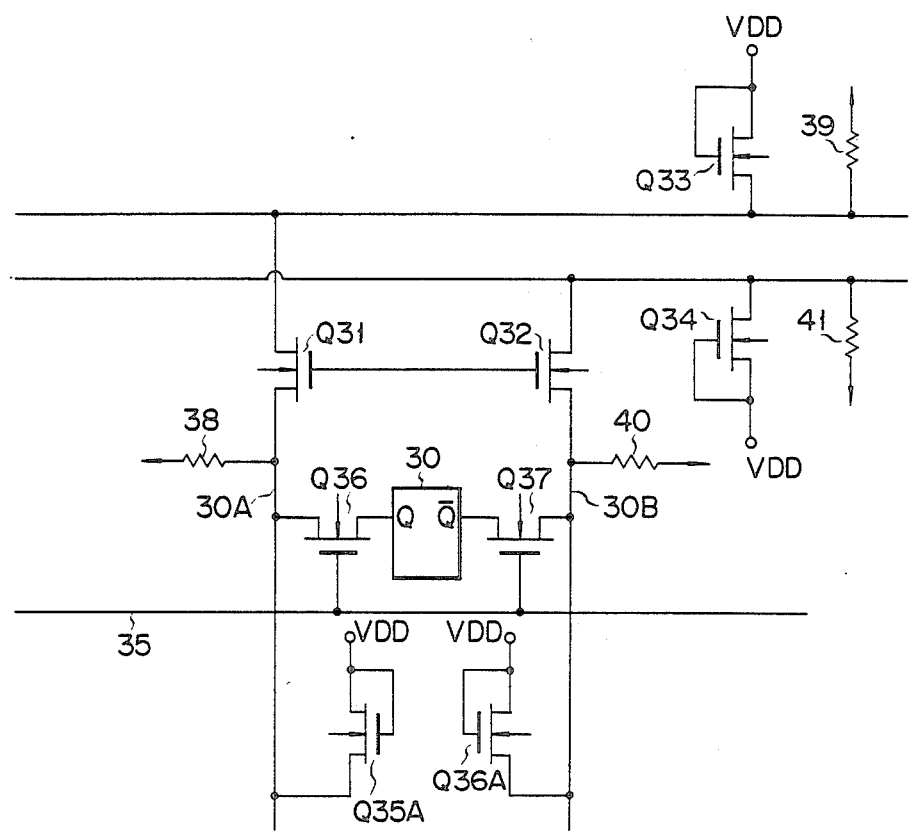

FIG. 8 shows an additional embodiment of the present invention. In this embodiment, the present invention is applied to an enhancement type static RAM. In FIG. 8, a memory cell 30 is a known flip-flop made up of a resistor and an enhancement type transistor (not shown). Reference numeral 34 designates a word line. The Q terminal of the flip-flop 30 is connected through an N channel MOS transistor Q36 as a transfer gate to a bit line 30A. The Q bar terminal of the flip-flop 30 is connected through an N channel MOS transistor Q37 as a transfer gate to a bit line 30B. The gates of these transistors Q36 and Q37 are connected to the word line 35. The bit lines 30A and 30B contain N channel MOS transistors Q31 and Q32 as transfer gates, respectively. N channel MOS transistors Q33 and Q35A connected to the bit line 30A provide bit line potential. Similarly, N channel MOS transistors Q34 and Q36A are connected to the bit line 30B, to set its bit line potential. The drains of the transistors Q33, Q34, Q35A and Q36A are connected to the high power source $V_{DD}$. The sources of the transistors Q33 and Q35A are connected to the bit line 30A. Similarly, the transistors Q34 and Q36A are connected to the bit line 30B. Resistors 38 and 39 connected to the bit line 30A, and resistors 40 and 41 connected to the bit line 30B are for bypadding the weak inversion current. More specifically, the resistor 38 provides a current path for a current substantially equal to the weak inversion current of the transistor Q31. The resistor 39 provides a current path for a current substantially equal to the weak inversion current of the transistor Q33. The same thing is true for the combinations of the remaining resistors 40 and 41 and transistors Q32 and Q34.

FIG. 9 shows a further embodiment of the present invention. In this embodiment, a weak inversion current bypassing circuit 23 operating comprises a depletion type MOS transistor with of a constant current feature. As shown, a memory cell 11 is an N channel MOS transistor of the double layer polysilicon structure having a floating gate. A word line 12 is connected to the floating gate and the control gate of the cell transistor 11. The drain of the transistor 11 is connected to a bit line 13. The source of the transistor 11 is coupled with the power source $V_{SS}$. The N channel MOS transistor 14 inserted in the bit line 13 serves as a transfer gate. N channel transistors 15 and 16 make up a clamp circuit 19. A bias circuit 18 biases the transistors 15 and 16 of the clamp circuit 19. A resistive load circuit 17 is also connected to the bit line 13. The transistor 16 serving as a transfer gate is located closer to the data output terminal $D_{OUT}$ than the transistor 14 also serving as a transfer gate. The bias voltage output from the bias circuit 18 is generally set at 2 V when the threshold voltage of each of the transistor 15 and 16 is 1 V. Accordingly, a maximum potential ($V_B - V_{TH}$) on the bit line 13 is clamped at 1 V. The resistive load is located closer to the output terminal $D_{OUT}$ than the transfer gate 16.

The discharge circuit 23 is comprised of a P channel enchancement type transistor Q51, an N channel depletion type transistor Q52, and N channel enhancement type transistors Q53 to Q56. The transistors Q55 and Q56 are connected in series between a node S1 of the bit line 13 and the power source $V_{SS}$. The node S1 is a node between the transistors 14 and 15. The transistor Q51 is placed between the power source $V_{DD}$ and the gate of the transistor Q55. The current paths of the transistors Q52 to Q54 are connected in series and between the power sources $V_{DD}$ and $V_{SS}$. The gates of the transistors Q52, Q53 and Q55 are interconnected and to the source of the transistor Q52 and the drain of the transistor Q53. S2 designates a node between the current paths of the transistors Q52 and Q53, S3 a node between the current paths of the transistors Q55 and Q56, S4 a node between the transistors Q53 and Q54. A potential Vs2 at the node S2, the high power source potential $V_{DD}$, and the threshold voltage $V_{THD}$ of the transistor Q52 are related by the following relation Hence, $V_{DD} + V_{THD} > Vs2$ If the above relation is satisfied, the transistor Q52 feeds a constant current.

Figure 10:
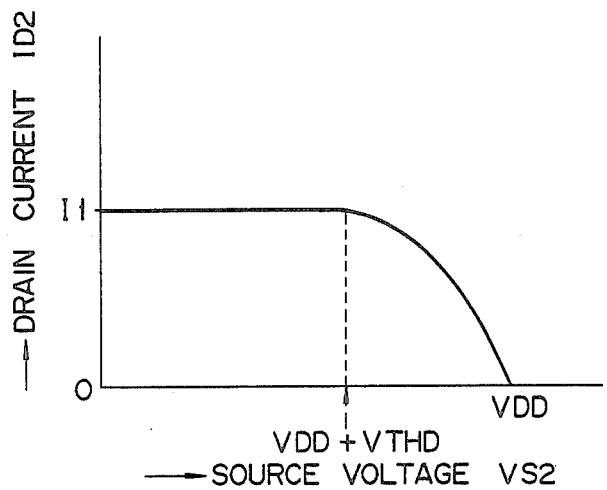
FIG. 10 shows a current characteristic of a weak inversion current bypassing circuit in the semiconductor memory device shown in FIG. 9.

A variation of the drain current ID of the transistor Q52 with respect to the potential Vs2 at the source of the transistor Q52 is shown in FIG. 10. As seen from the graph of FIG. 10, the drain current ID is kept constant in the range where the above expression is satisfied.

A chip select signal A is applied to the gates of the transistors Q51 and Q54. The chip select signal A is at $V_{DD}$ level in a chip select mode, while it is at $V_{SS}$ level in a chip nonselect mode. The gate of the transistor Q56 is coupled with the high power source $V_{DD}$.

A ratio of the channel width to length of the transistor Q53 is given by $$W1/L1 \times N$$

where $N > 1$, and W1 and L1 of the channel width and length of the transistor Q55.

A ratio of the channel width to length of the transistor Q54 is given $$W2/L2 \times N$$

where $N > 1$, and W2 and L2 are the channel width and length of the transistor Q56.

Further, the channel width to length ratio of the transistor Q52 is much smaller than that of each transistor Q55 and Q56.

In a chip select mode, the transistor Q51 is turned off and the transistor Q54 is turned on, and the following relation holds $$V_{DD} + V_{THD} > Vs2$$

Accordingly, a constant current flows through the transistor Q52.

Since the gate of the transistor Q56 is connected to the $V_{DD}$, if the ratio W2/L2 of the transistor Q56 is sufficiently large, its mutual conductance gm is large, and hence its resistive component is neglibile. In this case, accordingly, the potential Vs2 at the node S2 is determined by a current amplification factor $\beta$ of the transistor Q54. The current I1 flowing through the transistor Q52 is $$I1 = \beta/2 \times (Vs2 - V_{THN})^2,$$

where $V_{THN}$ is a threshold voltage of the transistor Q54. The mutual conductance of each of the transistor Q53 and Q54 is much larger than that of the transistor Q52. Therefore, the potential Vs2 is slightly larger than the threshold voltage $V_{THN}$ of the transistor Q54. Then, the following relation holds $$Vs2 < V_{THN} + 0.3 V$$

The potential Vs2 at the node S2 is applied to the gate of the transistor Q55. The channel width to length ratio of the transistor Q53 is N times that of the transistor Q53. The channel width to length ratio of the transistor Q54 is N times that of the transistor Q56. The gates of the transistors Q53 and Q55 are applied with the equal potential. In a chip select mode, the gates of the transistors Q54 and Q56 are applied with the equal potential ($V_{DD}$). Further, the potential Vs3 at the node S3 is low. $Vs3 < Vs2$, and $Vs3 < V_{THN} + 0.3$ V. Therefore, the transistor Q55 operates in a similar way to that of the transistor Q55. Hence, the bypass current I2 of the transistor Q55 is $$I2 = I1/N$$

This expression teaches that the current I2 is constant irrespective of the bias voltage of the bias circuit 18 and the $V_{DD}$ level.

Figure 11:
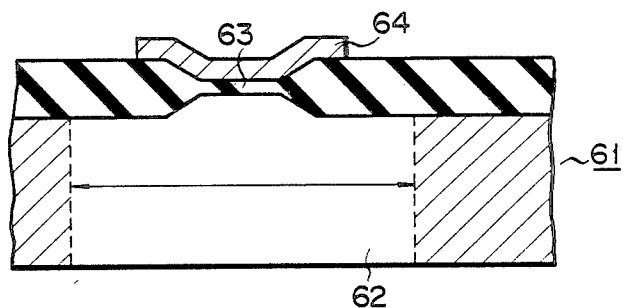
FIG. 11 shows a cross sectional view of an N channel depletion transistor assembled into the weak inversion current bypass circuit in the semiconductor memory device of FIG. 9.

If I2=1 μA, I1=N μA. In this case, the transistor Q52 of the depletion type must be formed which is capable of feeding a current of N μA. As already described, the transistor Q52 must have a satisfactorily small ratio of channel width to length. That is, it only needs a geometry of a long channel length and a small channel width. However, if the channel width is small, the threshold voltage $V_{THD}$ of the transistor Q52 is high. To cope with this problem, in manufacturing the memory device, as shown in FIG. 11, the channel region of the transistor Q52 and its peripheral region 62 (regions not hatched) are formed off the ion implantation region so that these regions are not ion implanted. If so manufactured, the threshold voltage $V_{THD}$ is prevented from being varied. In FIG. 11, reference numeral 63 designates a gate insulation film formed on the substrate 61, and numeral 64 a gate electrode formed on the insulation film 63.

Figure 12:
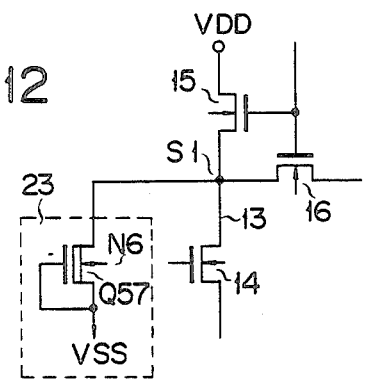
FIG. 12 is a circuit diagram of another weak inversion current bypass circuit, which is used in the semiconductor device of FIG. 9.

The bypass circuit 23 in the FIG. 9 enbodiment may be replaced by the circuit arrangement as shown in FIG. 12. The circuit 23 of FIG. 12 is made up of only an N channel depletion type transistor Q57 having a constant current feed nature. The transistor Q57 is inserted between the bit line 13 and the node S1. The gate of the transistor Q57 is connected to its source. The bypass current to be flowed is extremly small, e.g. 1 μA. In this bypass circuit, the channel length L of the transistor must be satisfactorily long.

Figure 1:
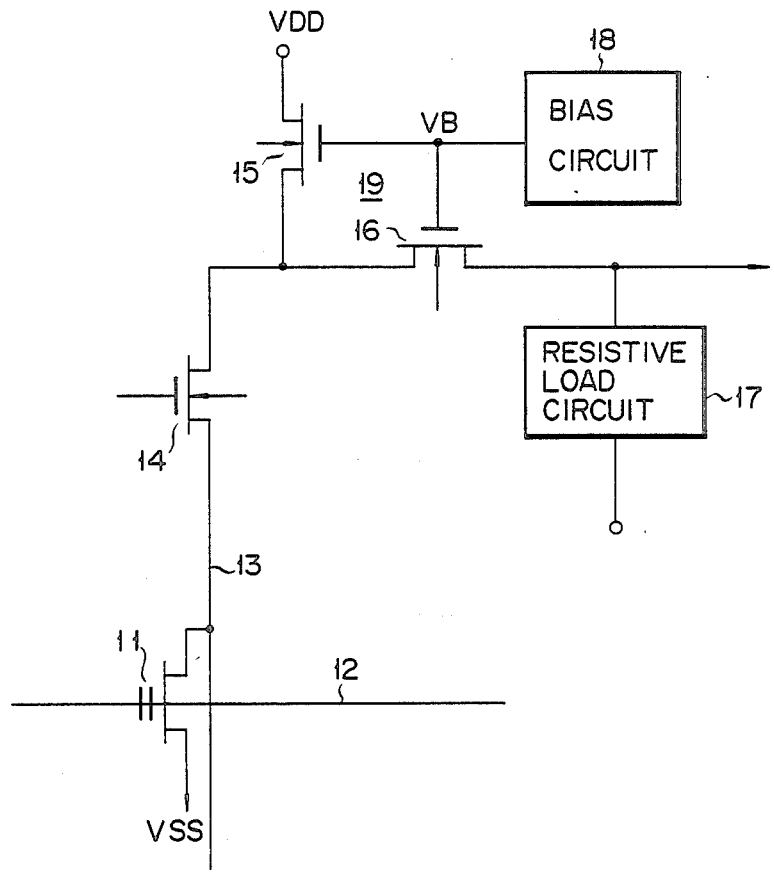
FIG. 1 shows the signal read out circuit of a conventional EPROM (erasable and programmable read only memory)

FIG. 13 shows a relationship of the memory operation cycle v.s. access time of the memory device of the present invention shown in FIG. 2 and that of the prior art shown in FIG. 1. In the graph, a curve denoted as I indicates the relationship of the present invention, while a curve II indicates that of the prior art. As shown, the access time is small over the entire range of the operation cycle as measured.

As seen from the foregoing description, provided is the bypassing circuit for bypassing the weak inversion current which is generated in the transistors of the clamp circuit when the memory operation cycle is long. Therefore, the access time elongating problem inevitable for the prior art is successfully solved, thus securing a high speed memory operation performance.

What is claimed is:

1. A semiconductor memory device comprising:
   a bit line;
   a memory cell connected to said bit line;
   clamp circuit means connected between a power source voltage and said bit line, for clamping said power source voltage and for applying the clamped voltage to said bit line, said clamp circuit means comprising a load MOS transistor whose output current path is connected between said power source voltage and said bit line;
   bypass circuit means connected between said bit line and a reference voltage, for bypassing from said bit line to said reference voltage an electric current the amount of which is substantially equal to that of a weak inversion current of said load transistor flowing into said bit line, said bypass circuit means comprising a bypass MOS transistor whose output current path is connected between said bit line and said reference voltage; and
   bias circuit means connected to said load MOS transistor and said bypass MOS transistor, for biasing said load and bypass MOS tansistors.

2. A semiconductor memory device according to claim 1, wherein said bias circuit means comprises a biasing circuit for generating a bias voltage, and the gate of said load MOS transistor and the gate of said bypass MOS transistor are connected to said biasing circuit and applied with said bias voltage of said biasing circuit.

3. A semiconductor memory device according to claim 2, further comprising a MOS transistor serially connected to said bypass MOS transistor wherein the drain and gate of said MOS transistor are connected to each other.

4. A semiconductor memory device according to claim 2, further comprising a MOS transistor with a floating gate serially connected to said bypass MOS transistor, the gate of said MOS transistor with a floating gate being connected to a predetermined voltage.

5. A semiconductor memory device according to claim 1, wherein said bias circuit means comprises first and second biasing circuits for generating first and second bias voltages, respectively, the gate of said load MOS transistor is connected to said first biasing circuit and applied with said first bias voltage of said first biasing circuit, and the gate of said bypass MOS transistor is connected to said second biasing circuit and applied with said second bias voltage of said second biasing circuit.

6. A semiconductor memory device according to claim 5, wherein said second biasing circuit comprises means for connecting the drain and gate of said bypass MOS transistor.

7. A semiconductor memory device according to claim 5, wherein said second biasing circuit comprises a current mirror circuit, and said second bias voltage of said second biasing circuit corresponds to an electric current flowing through said current mirror circuit.

8. A semiconductor memory device comprising:
   a bit line;
   a memory cell connected to said bit line;
   clamp circuit means connected between a power source voltage and said bit line, for clamping said power source voltage and for applying the clamped voltage to said bit line, said clamp circuit means comprising a load MOS transistor whose output current path is connected between said power source voltage and said bit line;
   bypass circuit means connected between said bit line and a reference voltage, for bypassing from said bit line to said reference voltage an electric current the amount of which is substantially equal to that of a weak inversion current of said load transistor flowing into said bit line, said bypass circuit means comprising an N channel MOS transistor of depletion type whose gate and source are interconnected, and the N channel MOS transistor having a constant current characteristic independent of said power source voltage; and
   bias circuit means connected to said load MOS transistor, for biasing said load transistor.

9. A semiconductor memory device according to claim 8, wherein said N channel MOS transistor is connected between said power source voltage and said bit line.

10. A semiconductor memory device according to claim 8, wherein said N channel MOS transistor is connected between said bit line and said reference voltage.

11. A semiconductor memory device according to claim 8, wherein said bypass circuit means further comprises a first N channel MOS transistor of enhancement type whose drain is connected to said bit line, a second N channel MOS transistor of enhancement type inserted between the source of said first MOS transistor and said reference voltage and whose gate is connected to said power source voltage, a third N channel MOS transistor of enhancement type whose drain and gate are connected to the source of said depletion type MOS transistor, and a fourth N channel MOS transistor of enhancement type inserted between the source of said third MOS transistor and said reference voltage and whose gate is supplied with a chip select signal.

12. A semiconductor memory device according to claim 8, wherein the channel region of said depletion type MOS transistor is not ion-implanted.

* * * * *